United States Patent
Hsia

[19]

[11] Patent Number: 5,990,523
[45] Date of Patent: Nov. 23, 1999

[54] CIRCUIT STRUCTURE WHICH AVOIDS LATCHUP EFFECT

[75] Inventor: Liang-Choo Hsia, Hsinchu Hsien, Taiwan

[73] Assignee: United Integrated Circuits Corp., Hsinchu, Taiwan

[21] Appl. No.: 09/306,114

[22] Filed: May 6, 1999

[51] Int. Cl.$^6$ .................................................. H01L 29/76
[52] U.S. Cl. ........................ 257/372; 257/369; 257/372; 326/83; 326/15; 326/112; 326/119; 326/121; 327/310; 327/313; 327/576
[58] Field of Search ..................... 257/372, 373, 257/369, 394, 547; 326/15, 33, 34, 83, 121, 110, 81, 108, 112, 119; 327/210, 310, 312, 313, 389, 390, 433, 437, 576, 538

[56] References Cited

U.S. PATENT DOCUMENTS

| | | | |
|---|---|---|---|
| 4,209,713 | 6/1980 | Satou et al. | 327/310 |
| 5,041,894 | 8/1991 | Reczek et al. | 257/372 |
| 5,760,631 | 6/1998 | Yu et al. | 327/313 |

OTHER PUBLICATIONS

Hargrove et al., "Latchup in COMS Technology," IEEE 98CH36173, p. 269, Jun. 1998.

*Primary Examiner*—Tom Thomas
*Assistant Examiner*—Shouxiang Hu
*Attorney, Agent, or Firm*—Jiawei Huang; J. C. Patents

[57] ABSTRACT

A circuit structure which avoids a latchup effect. An N-well is formed in a P-type substrate. An N-type contact is formed in the N-well. A PMOS is located on the N-well. A gate of the PMOS connects to an input terminal and a source region of the PMOS connects to a voltage source. A first NMOS and a second NMOS are located on the P-type substrate. A gate of the first NMOS connects to the input terminal, a source region of the first NMOS connects to a ground terminal, and a drain region of the first NMOS connects to an output terminal and a drain region of the PMOS. A gate of the second NMOS connects to the output terminal, a source region of the second NMOS connects to a voltage source, and a drain region of the second NMOS connects to the N-type contact.

8 Claims, 4 Drawing Sheets

5,990,523

CIRCUIT STRUCTURE WHICH AVOIDS LATCHUP EFFECT

CROSS-REFERENCE TO RELATED APPLICATION

This application claims the priority benefit of Taiwan application serial no. 88106103, filed Apr. 16, 1999, the full disclosure of which is incorporated herein by reference.

BACKGROUND OF THE INVENTION

1. Field of the Invention

The present invention relates to a semiconductor circuit structure. More particularly, the present invention relates to a circuit structure which avoids a latchup effect.

2. Description of the Related Art

A complementary metal oxide semiconductor (CMOS), a basic semiconductor device, comprises a P-type metal oxide semiconductor (PMOS) and an N-type metal oxide semiconductor (NMOS). The CMOS consumes less power and the speed of the CMOS is as fast as the NMOS, so that the CMOS is widely used to fabricate high-integration devices.

FIG. 1 is a schematic, cross-sectional diagram of a conventional CMOS. FIG. 2 is a schematic circuit diagram of the CMOS in FIG. 1. The same component in FIGS. 1 and 2 is indicated by the same numeral.

Referring to FIGS. 1 and 2, an N-well 102 is in a P-type substrate 100. A PMOS 104 is on the N-well 102 and an N-type contact 108 is in the N-well 102. A P-type contact 110 is in the P-type substrate 100 and an NMOS 106 is on the P-type substrate 100. A gate of the PMOS 104 and a gate of the NMOS 106 connect to an input terminal 112. A drain region of the PMOS 104 and a drain region of the NMOS 106 connect to an output terminal 114. A source region of the PMOS 104 and the N-type contact 108 connect to a voltage source 116. A source region of the NMOS 106 and the P-type contact 110 connect to a ground terminal 118.

When a voltage of the input terminal 112 is "High", the NMOS 106 is ON and the PMOS 104 is OFF. Therefore, a voltage of the output terminal 114 is about equal to the ground terminal which is about $V_{ss}$. When the voltage of the input terminal 112 is "Low", the NMOS 106 is OFF and the PMOS 104 is ON. The voltage of the output terminal 114 is about $V_{dd}$ which is about equal to the voltage source 116.

However, a parasitic bipolar transistor is easily formed in the CMOS. For example, in FIG. 1, a vertical, PNP-type bipolar transistor (not shown) is formed by the drain region of the PMOS 104, the N-well 102 and the P-type substrate 100. Two horizontal, NPN-type bipolar transistors (not shown) are formed respectively by the source region and the drain region of the NMOS 106, the P-type substrate 100 and the N-well 102. A positive feedback loop (not shown) is formed by these two bipolar transistors. Furthermore, these two bipolar transistors connect to each other in a structure similar to a PNPN-type diode as shown in FIG. 3.

While operating the CMOS, if a current passes through the PNPN-type diode that is larger than a triggering current of the PNPN-type diode, the PNPN-type diode is activated. A low resistance current path (not shown) is established between the voltage 116 and the ground terminal 118 at this time, so that massive current flows in this current path. This means that current leaks from the N-well. The function of the CMOS temporarily or permanently fails. This is known as a latchup effect, and occurs during CMOS operation.

SUMMARY OF THE INVENTION

Accordingly, the present invention provides a circuit structure which avoids a latchup effect while operating a complementary metal oxide semiconductor.

To achieve these and other advantages and in accordance with the purpose of the invention, as embodied and broadly described herein, the invention provides a structure as follows. An N-well is formed in a P-type substrate. An N-type contact is formed in the N-well. A PMOS is located on the N-well. A gate of the PMOS connects to an input terminal and a source region of the PMOS connects to a voltage source. A first NMOS and a second NMOS are located on the P-type substrate. A gate of the first NMOS connects to the input terminal, a source region of the first NMOS connects to a ground terminal, and a drain region of the first NMOS connects to an output terminal and a drain region of the PMOS. A gate of the second NMOS connects to the output terminal, a source region of the second NMOS connects to a voltage source, and a drain region of the second NMOS connects to the N-type contact.

In the invention, an additional NMOS connects to the N-well on which is the PMOS of the CMOS. By using the additional NMOS, the positive feedback loop formed by parasitic bipolar transistors is avoided while operating the CMOS. As a result, the latchup effect is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
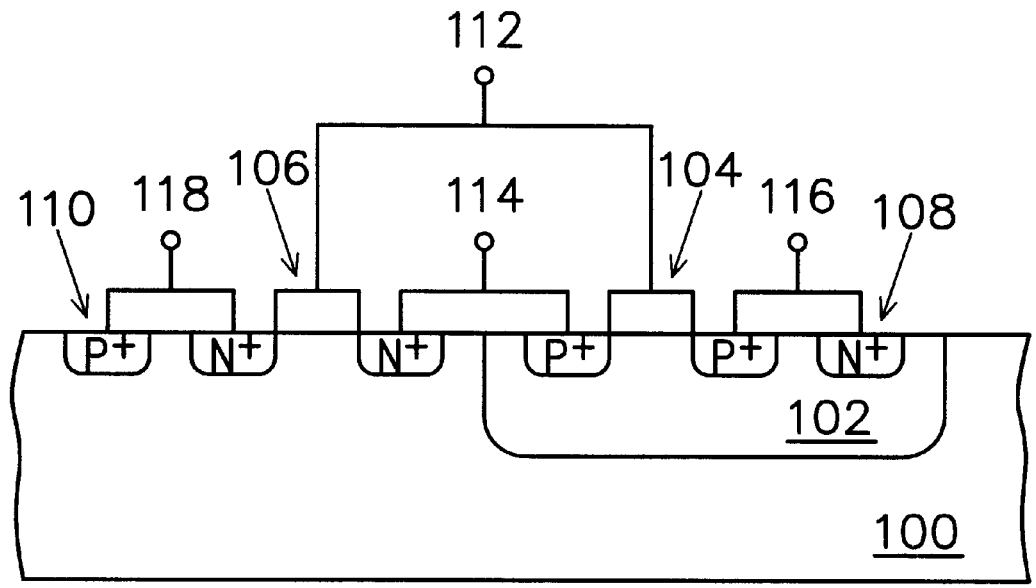
FIG. 1 is a schematic, cross-sectional diagram of a conventional CMOS.
Figure 2:
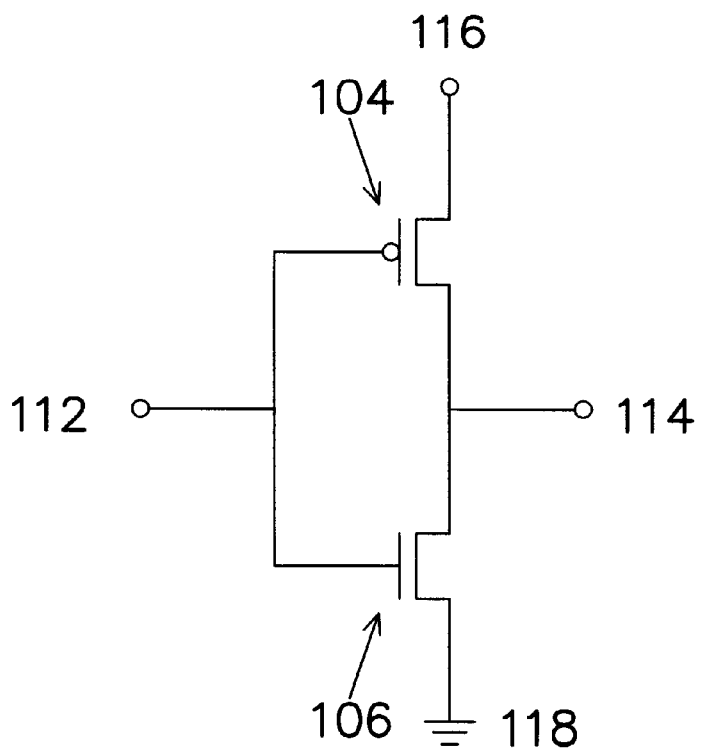
FIG. 2 is a schematic circuit diagram of the CMOS in FIG. 1.
Figure 3:
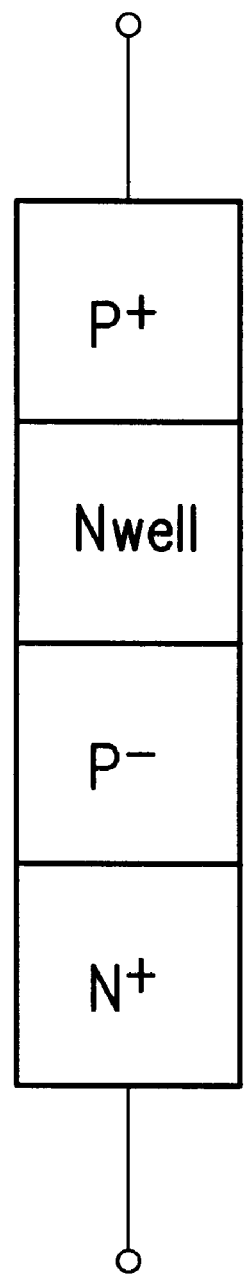
FIG. 3 is a schematic diagram of a PNPN-type diode.

Reference will now be made in detail to the present preferred embodiments of the invention, examples of which are illustrated in the accompanying drawings. Wherever possible, the same reference numbers are used in the drawings and the description to refer to the same or like parts.

Figure 4:
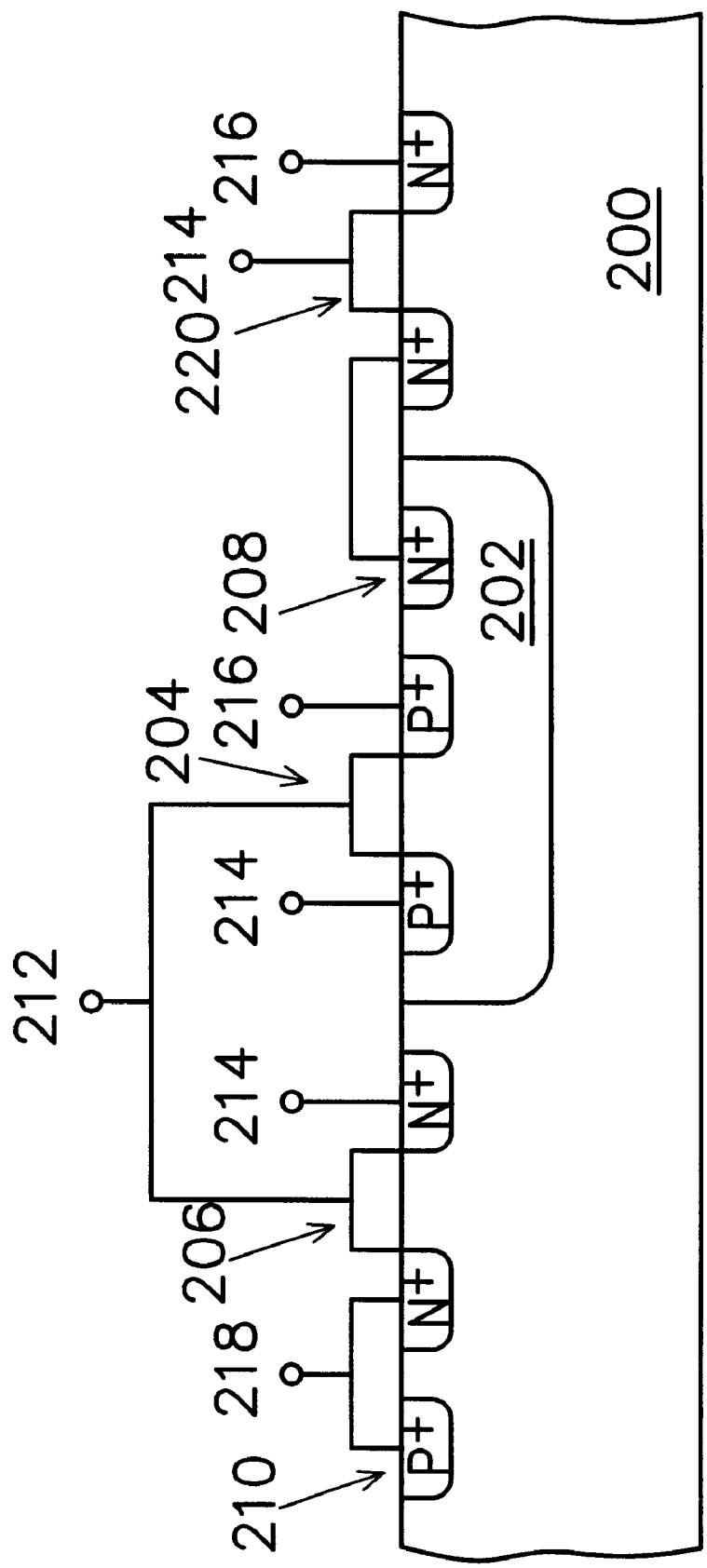
FIG. 4 is a schematic, cross-sectional diagram of a CMOS according to the invention.
Figure 5:
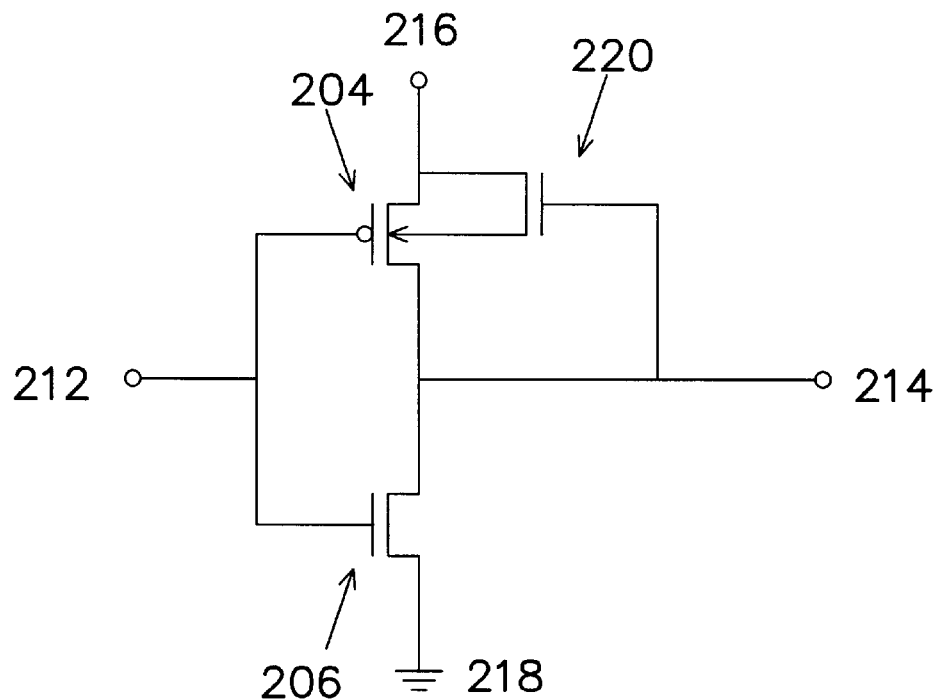
FIG. 5 is a schematic circuit diagram of the CMOS according to the invention in FIG. 4.

FIG. 4 is a schematic, cross-sectional diagram of a CMOS according to the invention. FIG. 5 is a schematic circuit diagram of the CMOS according to the invention in FIG. 4. The same component in FIGS. 4 and 5 is indicated by the same numeral.

Referring to FIGS. 4 and 5, an N-well 202 is in a P-type substrate 200. A PMOS 204 is on the N-well 202 and an N-type contact 208 is in the N-well 202. A P-type contact 210 is in the P-type substrate 200 and NMOS 206 and 220 is on the P-type substrate 200.

A gate of the PMOS 204 and a gate of the NMOS 206 connect to an input terminal 212. A drain region of the PMOS 204, a drain region of the NMOS 206 and a gate of the NMOS 220 connect to an output terminal 214. A source region of the PMOS 204 and a drain region of the NMOS 220 connect to a voltage source 216. A source region of the NMOS 206 and the P-type contact connect to a ground terminal 218. A source region of the NMOS 220 connects to the N-type contact 208.

When a voltage of the input terminal 212 is "High", the NMOS 206 is ON and the PMOS 204 is OFF. Since the gate of the NMOS 220 connects to the drain region of the NMOS 206, and the NMOS 206 is ON, a voltage of the gate of the NMOS 220 is about $V_{ss}$, which is the voltage of the ground terminal 218. Additionally, a voltage of the output terminal 214 is about $V_{ss}$. However, since the voltage $V_{ss}$ is not large enough to turn on the NMOS 220, the NMOS 220 is OFF. Since the NMOS 220 is OFF, a current path in the N-well 202 (not shown) is closed, and the positive feedback loop (not shown) formed by parasitic bipolar transistors is also closed. As a result, a latchup effect is avoided.

When the voltage of the input terminal 212 is "Low", the NMOS 206 is OFF and the PMOS 204 is ON. Since the gate of the NMOS 220 connects to the drain region of the PMOS 204, the source region of the NMOS 220 connects to the voltage source 216 and the PMOS 204 is ON. A voltage of the gate of the NMOS 220 and a voltage of the drain region of the NMOS 220 are both about $V_{dd}$. Additionally, the voltage of the output terminal 214 is about $V_{dd}$. The voltage $V_{dd}$ is large enough to turn on the NMOS 220, so that the NMOS 220 is ON. Furthermore, the NMOS 220 provides a bias which is about $V_{dd}$-$V_t$ for the N-well 202.

Figure 6:
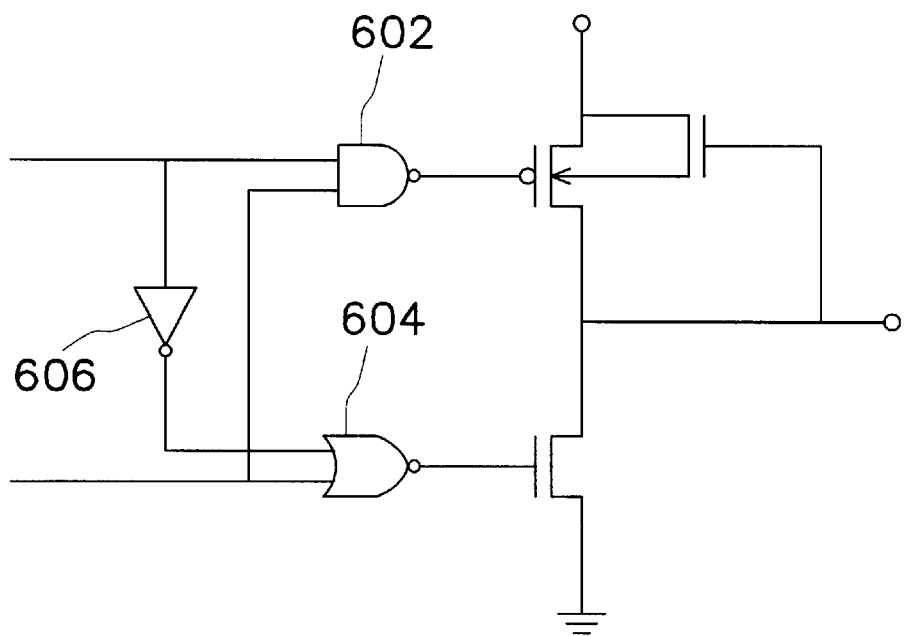
FIG. 6 is a schematic circuit diagram of an output driver having the circuit according to the invention.

FIG. 6 is a schematic circuit diagram of an output driver having the circuit according to the invention.

Referring to FIG. 6, the output driver includes the circuit shown in FIG. 5, a NAND gate 602, a NOR gate 604 and a converter 606. By using the circuit described above, the latchup effect is avoided during operating the output driver. Moreover, the performance of the output driver is not reduced.

In the invention, an additional NMOS connects to the N-well on which is the PMOS of the CMOS. When the PMOS is OFF, and the voltage of the drain region of the PMOS and the voltage of the drain region of the additional NMOS are "Low", the current path in the N-well is closed during operating the CMOS. Furthermore, the positive feedback loop formed by parasitic bipolar transistors is also closed. As a result, the latchup effect is avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit structure which avoids a latchup effect, the circuit structure comprising:

a substrate;

an N-type doped region in the substrate;

an N-type contact in the N-type doped region;

a P-type metal oxide semiconductor on the N-type doped region, wherein a gate of the P-type metal oxide semiconductor connects to an input terminal, and a source region of the P-type metal oxide semiconductor connects to a voltage source;

a first N-type metal oxide semiconductor on the substrate, wherein a gate of the first N-type metal oxide semi-
   conductor connects to the input terminal, a source region of the first N-type metal oxide semiconductor connects to a ground terminal, and a drain region of the first N-type metal oxide semiconductor connects to a drain region of the P-type metal oxide semiconductor and an output terminal; and a second N-type metal oxide semiconductor on the substrate, wherein a gate of the second N-type metal oxide semiconductor connects to the output terminal, a drain region of the second N-type metal oxide semiconductor connects to the voltage source, and a source region of the second N-type metal oxide semiconductor connects to the N-type contact.

2. A circuit structure which avoids a latchup effect, the circuit structure comprising:

a semiconductor substrate;

a doped region in the semiconductor substrate;

a contact whose type is the same as the doped region in the doped region;

a first MOS whose type is different from the doped region, wherein a gate of the first MOS connects to an input terminal, and a source region of the first MOS connects to a voltage source;

a second MOS whose type is the same as the doped region on the semiconductor substrate, wherein a gate of the second MOS connects to the input terminal, a source region of the second MOS connects to a ground terminal, and a drain region of the second MOS connects to a drain region of the first MOS and an output terminal; and a third MOS whose type is the same as the doped region on the semiconductor substrate, wherein a gate of the third MOS connects to the output terminal, a drain region of the third MOS connects to the voltage source, and a source region of the third MOS connects to the contact.

3. The circuit structure of claim 2, wherein impurities doped in the doped region are N-type.

4. A circuit structure which avoids a latchup effect, the circuit structure comprising:

a substrate;

an N-type doped region in the substrate;

an N-type contact in the N-type doped region;

a P-type metal oxide semiconductor on the N-type doped region, wherein a source region of the P-type metal oxide semiconductor connects to a voltage source;

a first N-type metal oxide semiconductor on the substrate, wherein a source region of the first N-type metal oxide semiconductor connects to a ground terminal, and a drain region of the first N-type metal oxide semiconductor connects to a drain region of the P-type metal oxide semiconductor; and second N-type metal oxide semiconductor on the substrate, wherein a gate of the second N-type metal oxide semiconductor connects to a drain region of the P-type metal oxide semiconductor, a drain region of the second N-type metal oxide semiconductor connects to the voltage source, and a source region of the second N-type metal oxide semiconductor connects to the N-type contact.

5. A circuit which avoids a latchup effect, the circuit comprising:

a P-type metal oxide semiconductor, wherein a source region of the P-type metal oxide semiconductor connects to a voltage source;

a first N-type metal oxide semiconductor, wherein a source of the first N-type metal oxide semiconductor connects to a ground terminal and a drain region of the first N-type metal oxide semiconductor connects to a drain region of the P-type metal oxide semiconductor; and a second N-type metal oxide semiconductor, wherein a gate of the second N-type metal oxide semiconductor connects to the drain region of the P-type metal oxide semiconductor, a drain region of the second N-type metal oxide semiconductor connects to the voltage source, and a source region of the second N-type metal oxide semiconductor connects to a doped well region in a semiconductor substrate of the P-type metal oxide semiconductor.

6. The circuit of claim 5, wherein a gate of the P-type metal oxide semiconductor connects to a gate of the first N-type metal oxide semiconductor.

7. The circuit of claim 5, further comprising:

a NAND gate having a first input terminal, a second input terminal and a first output terminal, wherein the first output terminal connects to the gate of the P-type metal oxide semiconductor;

a NOR gate having a third input terminal, a fourth input terminal and a second output terminal, wherein the second output terminal connects to the gate of the N-type metal oxide semiconductor and the fourth input terminal connects to the second input terminal;

a converter having a fifth input terminal and a third output terminal, wherein the fifth input terminal connects to the first input terminal and the third output terminal connects to the third input terminal.

8. The circuit of claim 5, further comprising:

a NAND gate having two input terminals and an output terminal, wherein the output terminal of the NAND gate connects to an input terminal of the P-type metal oxide semiconductor;

a NOR gate having two input terminals and an output terminal, wherein the output terminal of the NOR gate connects to an input terminal of the N-type metal oxide semiconductor and one input terminal of the NOR gate connects to one input terminal of the NAND gate; and a converter having an input terminal and an output terminal, wherein the input terminal of the converter connects to the other input terminal of the NAND gate and the output terminal of the converter connects to the other input terminal of the NOR gate.

* * * * *